United States Patent
Pei

(10) Patent No.: US 8,500,978 B2
(45) Date of Patent: *Aug. 6, 2013

(54) COMPOSITE COATING APPARATUS

(75) Inventor: Shao-Kai Pei, Taipei Hsien (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 216 days.

This patent is subject to a terminal disclaimer.

(21) Appl. No.: 12/869,707

(22) Filed: Aug. 26, 2010

(65) Prior Publication Data

US 2011/0253531 A1 Oct. 20, 2011

(30) Foreign Application Priority Data

Apr. 14, 2010 (TW) .............................. 99111662 A

(51) Int. Cl.

| C25B 9/00 | (2006.01) |
|---|---|
| C25B 11/00 | (2006.01) |
| C25B 13/00 | (2006.01) |
| C23C 14/00 | (2006.01) |
| C23C 16/00 | (2006.01) |
| C23C 16/50 | (2006.01) |

(52) U.S. Cl.
USPC ............ 204/298.26; 204/298.23; 204/298.25; 204/298.28; 204/298.41; 118/720; 118/723 VE; 118/723 CB; 118/723 EB; 118/726; 118/729; 118/730

(58) Field of Classification Search
USPC ...................... 118/719, 723 VE, 723 EB, 729, 118/730, 731, 720, 723 CB, 726; 204/298.26, 204/298.27, 298.28, 298.29, 298.41, 298.23, 204/298.25

See application file for complete search history.

(56) References Cited

U.S. PATENT DOCUMENTS

| 4,867,859 A | * | 9/1989 | Harada et al. ............ 204/298.04 |
| 4,877,505 A | * | 10/1989 | Bergmann ............... 204/192.38 |
| 4,992,153 A | * | 2/1991 | Bergmann et al. ....... 204/192.16 |
| 5,503,725 A | * | 4/1996 | Sablev et al. ............ 204/192.12 |
| 5,514,260 A | * | 5/1996 | Seo ......................... 204/298.26 |
| 6,494,997 B1 | * | 12/2002 | Israel et al. .............. 204/192.12 |
| 2011/0073472 A1 | * | 3/2011 | Pei .......................... 204/298.25 |
| 2011/0111131 A1 | * | 5/2011 | Vergohl et al. ................ 427/523 |

FOREIGN PATENT DOCUMENTS

JP 62162219 A * 7/1987

* cited by examiner

*Primary Examiner* — Michael Band
(74) *Attorney, Agent, or Firm* — Altis Law Group, Inc.

(57) ABSTRACT

A composite coating apparatus includes a main body, two carrying boards, and two actuators. The main body defines a first chamber and a second chamber with a separating board intervening therebetween. The separating board defines a coating opening intercommunicating with the chambers. The carrying boards are received in the first chamber and rotatably connected to the separating board at two sides of the coating opening. Each carrying board defines a receiving groove for holding a substrate. The actuators are configured for driving the carrying boards to rotate between a first coating position, in which the substrate is exposed to the second chamber for a first coating process carried out in the second chamber via the coating opening, and a second coating position, in which the substrate faces away from the separating board for a second coating process carried out in the first chamber.

2 Claims, 3 Drawing Sheets

COMPOSITE COATING APPARATUS

BACKGROUND

1. Technical Field

The present disclosure relates to coating apparatuses and, particularly, to a composite coating apparatus.

2. Description of Related Art

Some substrates may need to be subjected to both a sputter coating process and a vacuum evaporation process. Thus, it is required to transport the substrates between a sputter coating apparatus and a vacuum evaporation apparatus. However, during the transportation, the substrates are exposed to contaminations and may be oxidized, reducing the quality of the coating.

Therefore, it is desirable to provide a composite coating apparatus which can overcome the above-mentioned limitations.

BRIEF DESCRIPTION OF THE DRAWINGS

Many aspects of the present disclosure should be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the views.

DETAILED DESCRIPTION

Embodiments of the present disclosure will now be described in detail with reference to the drawings.

Figure 1:
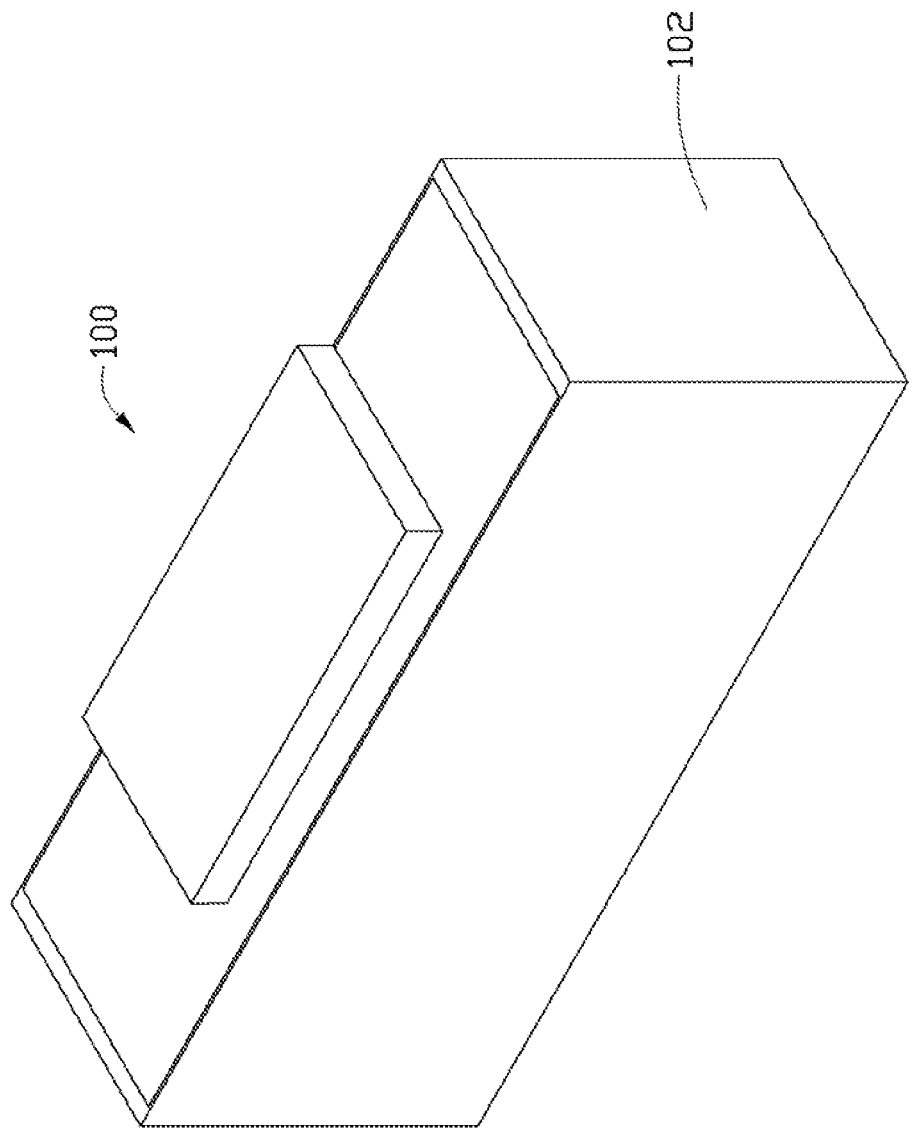
FIG. 1 is a schematic view of a composite coating apparatus, according to an embodiment.
Figure 2:
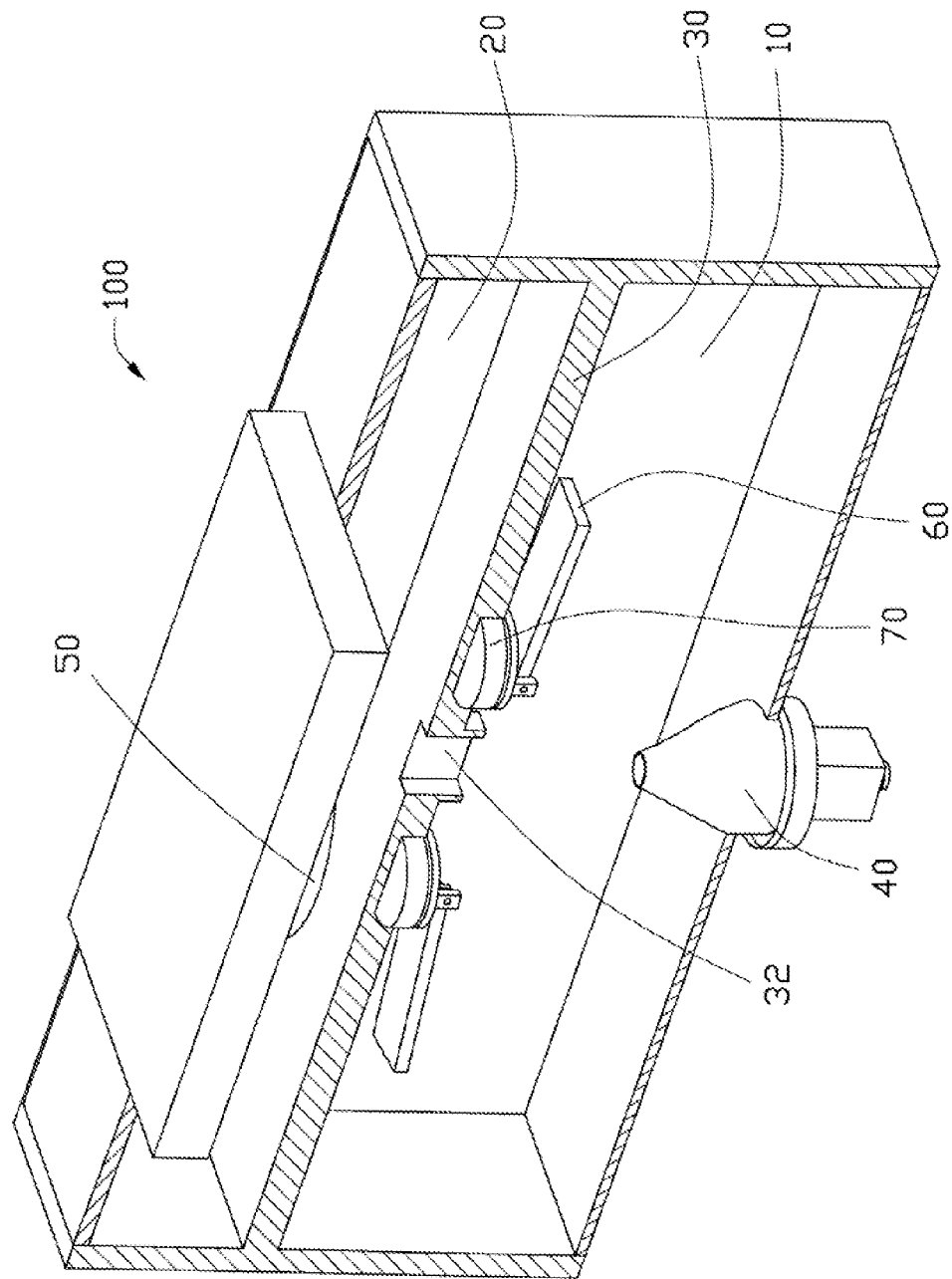
FIG. 2 is a cross-sectional view of the composite coating apparatus of FIG. 1.

Referring to FIGS. 1-2, a composite coating apparatus 100, according to one embodiment, includes a main body 102 that defines two chambers 10 and 20 with a separating board 30 intervening therebetween, an evaporation source 40, a sputter target 50, two carrying boards 60, and two actuators 70.

The chambers 10 and 20 are for respectively providing separated vacuum environments for a vacuum evaporation process and a sputter coating process. In this embodiment, the main body 102 and the two chambers 10 and 20 all have a cubic configuration, and the chambers 10 and 20 are respectively positioned at a lower portion and an upper portion thereof. Accordingly, the separating board 30 is a substantially rectangular board separating the chambers 10 and 20. However, the main body 102, the chambers 10 and 20, and the separating board 30 can have other configurations in other alternative embodiments, for example, the main body 102 and the chambers 10 and 20 can have a substantially cylindrical configuration and accordingly the separating board 30 is a circular board.

The separating board 30 defines a coating opening 32 intercommunicating the chambers 10 and 20, generally at the center thereof. The coating opening 32 is for exposing a substrate (not shown) which is received in the chamber 10 and needs to be coated to the chamber 20 (see below). Thus, the coating opening 32 needs to be shaped corresponding to the substrate. In this embodiment, the coating opening 32 is substantially rectangular.

The evaporation source 40 is configured for coating the substrate by evaporation. The sputter target 50 is configured for coating the substrate by sputtering.

Figure 3:
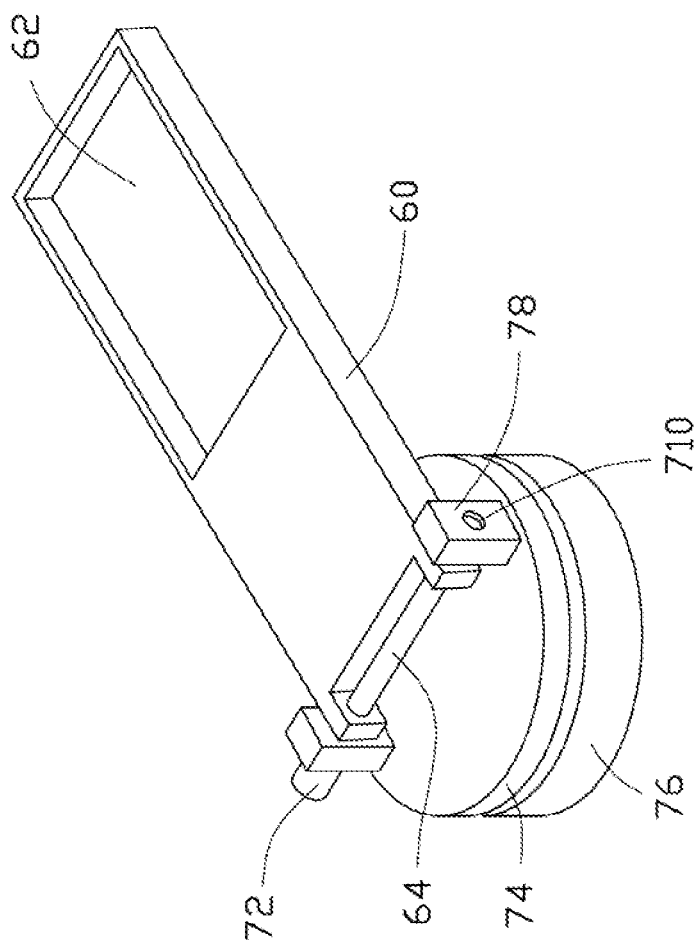
FIG. 3 is a schematic view of a carrying board and an actuator of the composite coating apparatus of FIG. 1.

Also referring to FIG. 3, each carrying board 60 is a substantially rectangular board and defines a receiving groove 62 in a surface thereof, generally at an end thereof. The receiving groove 62 is shaped to fittingly hold the substrate. Each carrying board 60 defines a shaft 64 at an end thereof, distant from the corresponding receiving groove 62. That the configuration of the carrying boards 60 is not limited to this embodiment but can be redesigned depending on requirements.

Each actuator 70 includes a first motor 72, a connecting board 74, and a second motor 76. The connecting board 74 is generally a circular board, connected to the second motor 76, and can be driven to rotate by the second motor 76. The connecting board 74 defines two shaft plates 78 extending upward from a surface thereof opposite to the second motor 76, at the two opposite diametrical surfaces. The distance between the two shaft plates 78 is substantially equal to or slightly larger than the width of the carrying boards 60. Each shaft plate 78 defines a shaft hole 710. The two shaft holes 710 are aligned with each other. The diameter of the shaft holes 710 is substantially equal to or slightly smaller than that of the shafts 64.

In assembly, the evaporation source 40 is received in the chamber 10, facing the coating opening 32. The sputter target 50 is received in the chamber 20, also facing the coating opening 32. The actuators 70 are received in the chamber 10 and the second motors 76 are secured to the separating board 30, substantially symmetrical at two opposite sides of the coating opening 32.

Each carrying board 60 is fittingly received between the corresponding shaft plates 78 and the shafts 64 thereof fittingly extend in the corresponding shaft holes 710. Thus, the carrying boards 60 are connected to the respective connecting boards 74. The friction between the carrying boards 60 and the shaft plates 78 and between the shafts 64 and the shaft holes 710 are large enough that the carrying boards 60 do not rotate about the shafts 64 until a driving force is applied. The shafts 64 are coupled to the first motors 72 to obtain the driving force from the first motors 72. Thus, the carrying boards 60 can be driven to rotate between a first coating position and a second coating position by the first motors 72. When a carrying board 60 is at the first coating position, the corresponding receiving groove 62 aligns and communicates with the coating opening 32, thus, the substrate held by the receiving groove 62 faces the sputter target 50. When the carrying board 60 is at the second coating position, the receiving groove 62 faces the evaporation source 40, thus the substrate held by the receiving groove 62 also faces the evaporation source 40.

In operation, the chambers 10 and 20 are vacuumized. The actuators 70 drive one of the carrying boards 60 to move to the first coating position and the other to move to the second position. Thus, one of the substrates is subjected to the sputter coating process and the other is subjected to the vacuum evaporation process. The actuators 70 drive the carrying board 60 from the first coating position to the next corresponding coating position and the carrying board 60 from the second coating position to the next corresponding first coating position, after both processes are finished. Thus, the sputtered substrate continues to be subjected to the vacuum evaporation process, and the evaporated substrate continues to be subjected to the sputter coating process, without departing from the vacuumized chamber 10. Thus, contaminations are avoided.

When a substrate is being subjected to the vacuum evaporation process, the corresponding second motor 76 can drive the corresponding carrying board 60 to rotate, thus, the uniformity of the coating can be improve. In other alternative embodiments, if the uniformity of the coating is already qualified without rotation of the carrying board 60, the second motors 76 can be omitted.

The connecting boards 74 are for coupling the carrying boards 60 to the separating board 30 and are not limited to this embodiment, other configurations that can rotatably connect the carrying boards 60 to the separating board 30 can be employed too.

The actuators 70 are mainly for driving the carrying boards 60 to rotate between the first coating position and the second coating position and are not limited to this embodiment, other configurations that can perform the rotating functions can be employed too.

It will be understood that the above particular embodiments and methods are shown and described by way of illustration only. The principles and the features of the present disclosure may be employed in various and numerous embodiment thereof without departing from the scope of the disclosure as claimed. The above-described embodiments illustrate the scope of the disclosure but do not restrict the scope of the disclosure.

What is claimed is:

1. A composite coating apparatus, comprising:
a main body defining a first and a second chambers with a separating board intervening therebetween, the separating board defining a coating opening intercommunicating the first and second chambers;
an evaporation source received in the first chamber and facing the coating opening and a sputter target;
the sputter target received in the second chamber and facing the coating opening and the evaporation source;
two carrying boards received within one of the first and second chambers and rotatably connected to the separating board, the carrying boards being positioned around the coating opening, each carrying board defining a receiving groove for holding a substrate; and
two actuators configured for driving the carrying boards to rotate between a first coating position and a second coating position, respectively; wherein when a specific one of the carrying boards is at the first coating position, a surface of the substrate held by the specific carrying board faces and aligns with the coating opening; and wherein when the specific carrying board is at the second coating position, the surface of the substrate held by the specific carrying board faces away from the separating board;
wherein each actuator comprises a connecting board and a first motor, each connecting board is connected to the separating board and extends two shaft plates upward from a surface thereof, each shaft plate defines a shaft hole, each carrying board extends a shaft at an end thereof distant from the receiving groove thereof, each of the carrying boards is received between the shaft plates of the respective actuator, the shaft of each of the carrying boards extends into the shaft holes of the connecting board of the respective actuator and is coupled to the first motor of the respective actuator, and each first motor is configured for driving the respective carrying board to rotate about the shaft between the first coating position and the second coating position.

2. The composite coating apparatus of claim 1, wherein each actuator further comprises a second motor connecting the connecting board thereof to the separating board, and each second motor is configured for driving the respective carrying board to rotate when the respective carrying board is at the second coating position.

* * * * *